United States Patent
Hunka et al.

(10) Patent No.: US 10,763,182 B2
(45) Date of Patent: Sep. 1, 2020

(54) POWER SEMICONDUCTOR DEVICE COMPRISING A HOUSING, AND METHOD FOR PRODUCING A POWER SEMICONDUCTOR DEVICE

(71) Applicant: SEMIKRON ELEKTRONIK GMBH & CO. KG, Nuremberg (DE)

(72) Inventors: Thomas Hunka, Nuremberg (DE); Stefan Weiss, Höchstadt (DE); Rainer Popp, Petersurach (DE)

(73) Assignee: SEMIKRON ELECTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 16/413,806

(22) Filed: May 16, 2019

(65) Prior Publication Data
US 2019/0385919 A1    Dec. 19, 2019

(30) Foreign Application Priority Data
Jun. 19, 2018 (DE) .................. 10 2018 114 691

(51) Int. Cl.
*H01L 23/04* (2006.01)
*H01L 23/48* (2006.01)
(Continued)

(52) U.S. Cl.
CPC ............. *H01L 23/04* (2013.01); *H01L 23/48* (2013.01); *H01L 23/528* (2013.01); *H01L 24/72* (2013.01);
(Continued)

(58) Field of Classification Search
None
See application file for complete search history.

(56) References Cited

U.S. PATENT DOCUMENTS

2014/0151868 A1 * 6/2014 Bayerer ................ H01L 23/049
257/690

FOREIGN PATENT DOCUMENTS

| DE | 1020110764324 | 11/2012 |
| DE | 102012219791 | 5/2013 |
| DE | 102017107763 | 10/2018 |

OTHER PUBLICATIONS

DE 10 2018 114 691.4, German Examination Report dated Jan. 22, 2019, 5 pages—German, 2 pages—English.

* cited by examiner

*Primary Examiner* — Lex H Malsawma
(74) *Attorney, Agent, or Firm* — Andrew F. Young, Esq.; Lackenbach Siegel, LLP

(57) ABSTRACT

The invention relates to a power semiconductor device having a pin element which passes through a housing opening, an elastic sealing device which is arranged between a housing opening wall of the housing, where the housing opening wall delimits the housing opening and encircles the pin element. The pin element runs through the sleeve and through a sealing device opening of the sealing element. The sealing device is not connected in a materially bonded manner to the sleeve, to the housing opening wall and to the pin element and the sealing device seals off the housing opening wall from the sleeve and seals off the sleeve from the pin element. A crosslinked potting compound is arranged on the sealing device. The crosslinked potting compound is connected in a materially bonded manner to the sleeve, to the housing opening wall and to the pin element and the potting compound seals off the housing opening wall from the sleeve and seals off the sleeve from the pin element.

14 Claims, 5 Drawing Sheets

(51) Int. Cl.
*H01L 23/528* (2006.01)
*H01L 23/00* (2006.01)
*H05K 7/14* (2006.01)
*H01R 12/71* (2011.01)

(52) U.S. Cl.
CPC ......... *H01R 12/714* (2013.01); *H05K 7/1427* (2013.01); *H01L 2224/8384* (2013.01); *H01L 2224/83801* (2013.01)

POWER SEMICONDUCTOR DEVICE COMPRISING A HOUSING, AND METHOD FOR PRODUCING A POWER SEMICONDUCTOR DEVICE

CROSS REFERENCE TO RELATED APPLICATIONS

This application relates to, and claims priority from, DE Ser. No. 10 2018 114 691.4 filed Jun. 19, 2018, the entire contents of which are incorporated herein by reference.

FIGURE SELECTED FOR PUBLICATION

FIG. 2.

BACKGROUND OF THE INVENTION

Field of the Invention

The present invention relates to a power semiconductor device comprising a housing, and to a method for producing a power semiconductor device.

Description of the Related Art

DE 10 2012 219 791 A1 discloses a power semiconductor device comprising power semiconductor components, a housing, and comprising electrical connection elements. The electrical connection elements of the power semiconductor device serve to electrically connect electrically conductive load current connection elements. Here, the electrical connection elements of the power semiconductor device run through a housing wall from the inside to the outside of the housing. In order to prevent the ingress of particles of dirt and moisture into the interior of the housing, the electrical connection elements of the power semiconductor device are sealed off from the housing wall.

ASPECTS AND SUMMARY OF THE INVENTION

One of the alternative and adaptive objects of the invention is to provide a power semiconductor device comprising a housing, in which power semiconductor device the ingress of particles of dirt and moisture into the interior of the housing are prevented in a reliable manner and over the long term.

One object is achieved by a power semiconductor device comprising a power semiconductor component, comprising a housing having a housing opening, comprising a pin element which passes through the housing opening and has a thread at least outside the housing, comprising an elastic sealing device which is arranged between a housing opening wall of the housing, which housing opening wall delimits the housing opening and encircles the pin element, and the pin element, and comprising an electrically conductive sleeve which forms an electrical connection element of the power semiconductor device, wherein the pin element runs through the sleeve and through a sealing device opening of the sealing element, wherein a first sealing element of the sealing device is arranged between the sleeve and the housing opening wall and a second sealing element of the sealing device is arranged between the sleeve and the pin element, wherein the sealing device is not connected in a materially bonded manner to the sleeve, to the housing opening wall and to the pin element and the sealing device seals off the housing opening wall from the sleeve and seals off the sleeve from the pin element, and comprising a crosslinked potting compound which is arranged on the sealing device, wherein the crosslinked potting compound is arranged between the sleeve and the housing opening wall and between the sleeve and the pin element, wherein the crosslinked potting compound is connected in a materially bonded manner to the sleeve, to the housing opening wall and to the pin element and the potting compound seals off the housing opening wall from the sleeve and seals off the sleeve from the pin element.

Furthermore, said object is achieved by a method for producing a power semiconductor device comprising the following method steps:

providing a power semiconductor device precursor product comprising a power semiconductor component, comprising a housing having a housing opening, comprising a pin element which is arranged within the housing and passes through the housing opening and has a thread at least outside the housing, comprising an elastic sealing device which is arranged between a housing opening wall of the housing, which housing opening wall delimits the housing opening and encircles the pin element, and the pin element, and comprising an electrically conductive sleeve which forms an electrical connection element of the power semiconductor device, wherein the pin element runs through the sleeve and through a sealing device opening of the sealing element, wherein a first sealing element of the sealing device is arranged between the sleeve and the housing opening wall and a second sealing element of the sealing device is arranged between the sleeve and the pin element, wherein the sealing device is not connected in a materially bonded manner to the sleeve, to the housing opening wall and to the pin element and the sealing device seals off the housing opening wall from the sleeve and seals off the sleeve from the pin element, arranging a liquid or gelatinous uncrosslinked potting compound on the sealing device, wherein the uncrosslinked potting compound is arranged between the sleeve and the housing opening wall and between the sleeve and the pin element, wherein the uncrosslinked potting compound is in mechanical contact with the sleeve, with the housing opening wall and with the pin element, crosslinking the uncrosslinked potting compound, as a result of which a crosslinked potting compound is formed which seals off the housing opening wall from the sleeve and seals off the sleeve from the pin element.

Advantageous developments of the method are evident in an analogous manner to advantageous developments of the power semiconductor device, and vice versa.

It has proven to be advantageous when the crosslinked potting compound is formed from a crosslinked silicone, in particular from a crosslinked silicone rubber, since very reliable sealing off is achieved in this case.

Furthermore, it has proven to be advantageous when the sleeve has a first recess which starts from its side that faces a pin element outer end of the pin element, which pin element outer end is arranged outside the housing, and which runs in the axial direction of the pin element, wherein the sealing device is of one-piece design and has a first connecting section which runs through the first recess and connects the first sealing element to the second sealing element, since the first sealing element is very reliably connected to the second sealing element in this case.

In this context, it has proven to be advantageous when the sleeve has a second recess which starts from its side that faces a pin element outer end of the pin element, which pin element outer end is arranged outside the housing, and which runs in the axial direction of the pin element, wherein the sealing device has a second connecting section which runs through the second recess and connects the first sealing element to the second sealing element, since the first sealing element is very reliably connected to the second sealing element in this way.

In this context, it has proven to be advantageous when the second recess is arranged opposite the first recess and the second connecting section is arranged opposite the first connecting section, since the first sealing element is particularly reliably connected to the second sealing element in this case.

It has further proven to be advantageous when the first and the second sealing element and the sleeve are each of hollow-cylindrical design and the pin element has a circular cross-sectional area, since round contours can be sealed off in a particularly reliable manner.

It has further proven advantageous when the sealing device is formed from an elastomer, since very reliable sealing off is achieved in this case.

Furthermore, it has proven to be advantageous when the power semiconductor device has a holding body, wherein the pin element is connected to the holding body in a rotationally fixed manner, in particular is injection-moulded into the holding body. As a result, the pin element is mechanically connected to the rest of the power semiconductor device in a very reliable manner.

Furthermore, it has proven to be advantageous when the power semiconductor device has an electrically conductive connecting element which is arranged within the housing and is electrically conductively connected to the power semiconductor component, wherein the electrically conductive sleeve is arranged over the connecting element, since the sleeve can be electrically conductively connected to the connecting element in a simple manner in this case.

In this context, it has proven to be advantageous when the sleeve is arranged on the connecting element. As a result, movement of the sleeve in the direction of the connecting element when the force-generating element generates a force on the load current connection element, which force acts in the direction of the sleeve, is reliably prevented.

Furthermore, a power semiconductor arrangement comprising a power semiconductor device according to the invention and comprising an electrically conductive load current connection element which has a third recess and is arranged outside the housing in such a way that the pin element runs through the third recess has proven to be advantageous, wherein a force-generating element of the power semiconductor arrangement, which force-generating element is twisted onto the thread of the pin element and has a thread, generates a force on the load current connection element, which force acts in the direction of the sleeve, as a result of which the load current connection element is arranged pressed against the sleeve and an electrically conductive pressure contact is formed between the sleeve and the load current connection element.

It should be noted that more than one of the elements described in the singular here can optionally be present.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
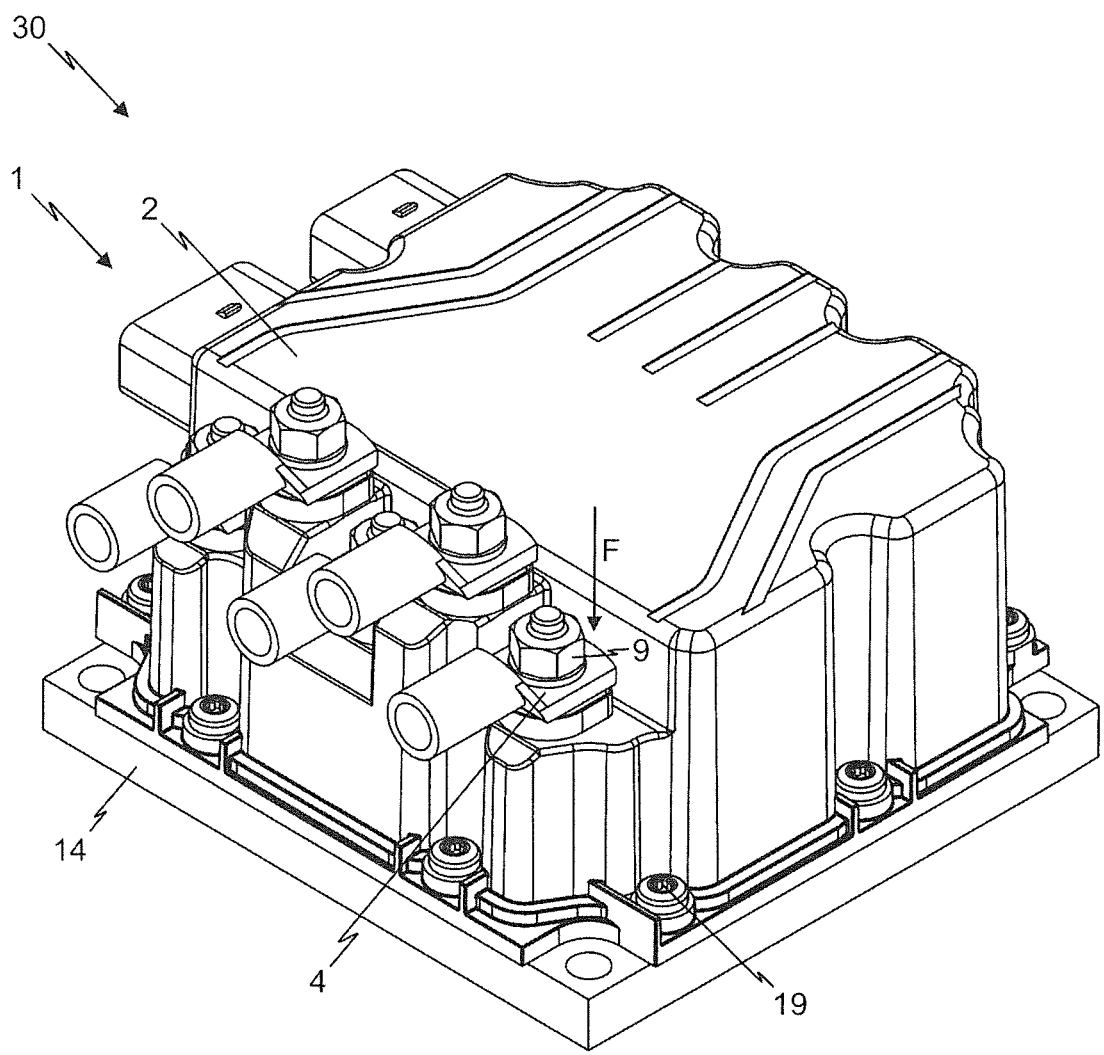
FIG. 1 shows a perspective view of a power semiconductor arrangement comprising a power semiconductor device according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure. Thus, the appearances of phrases such as "in one variant," "in one version," and the like, in various places in the specification are not necessarily all referring to the same version or variant, nor are separate or alternative versions or variants mutually exclusive of other versions or variants. Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items. Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

Figure 2:
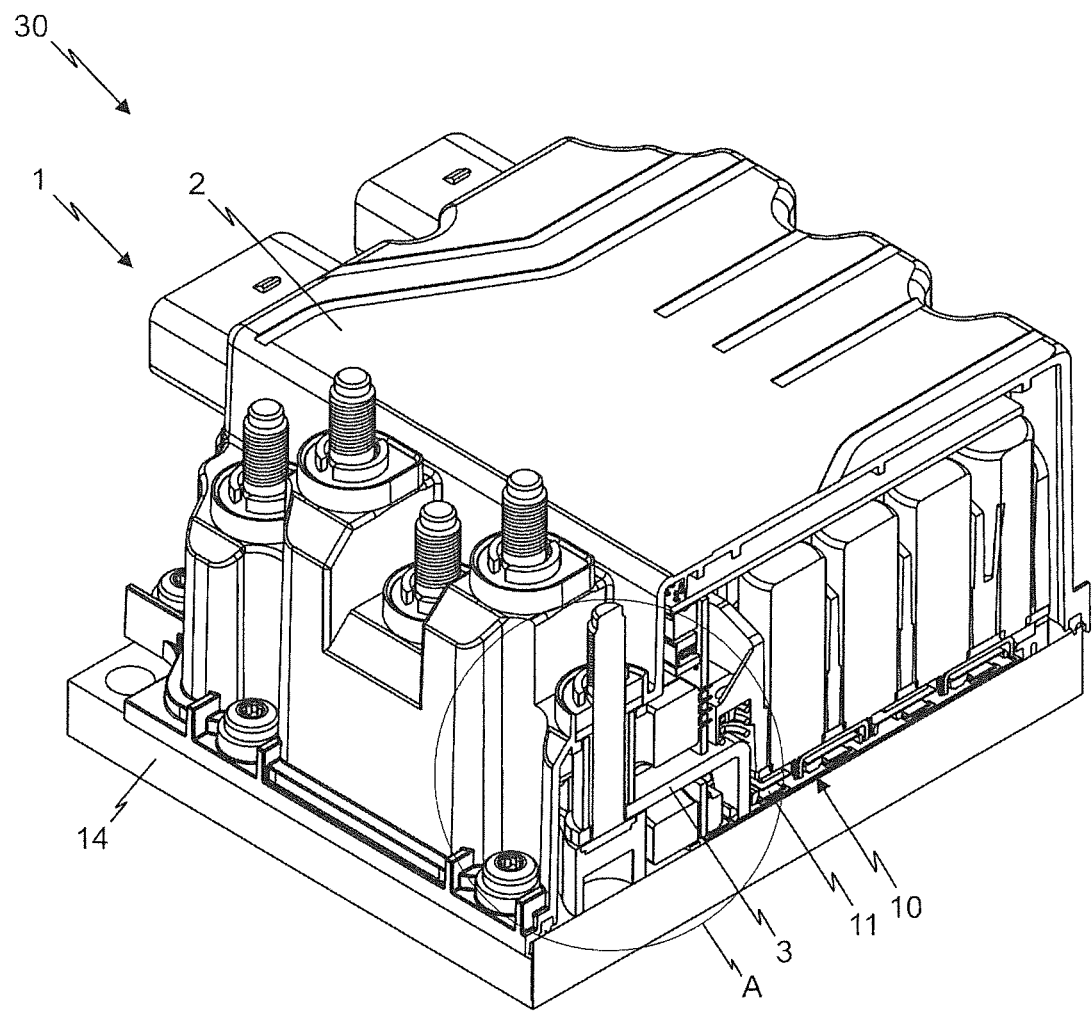
FIG. 2 shows a perspective partial sectional view of a power semiconductor device according to the invention.
Figure 3:
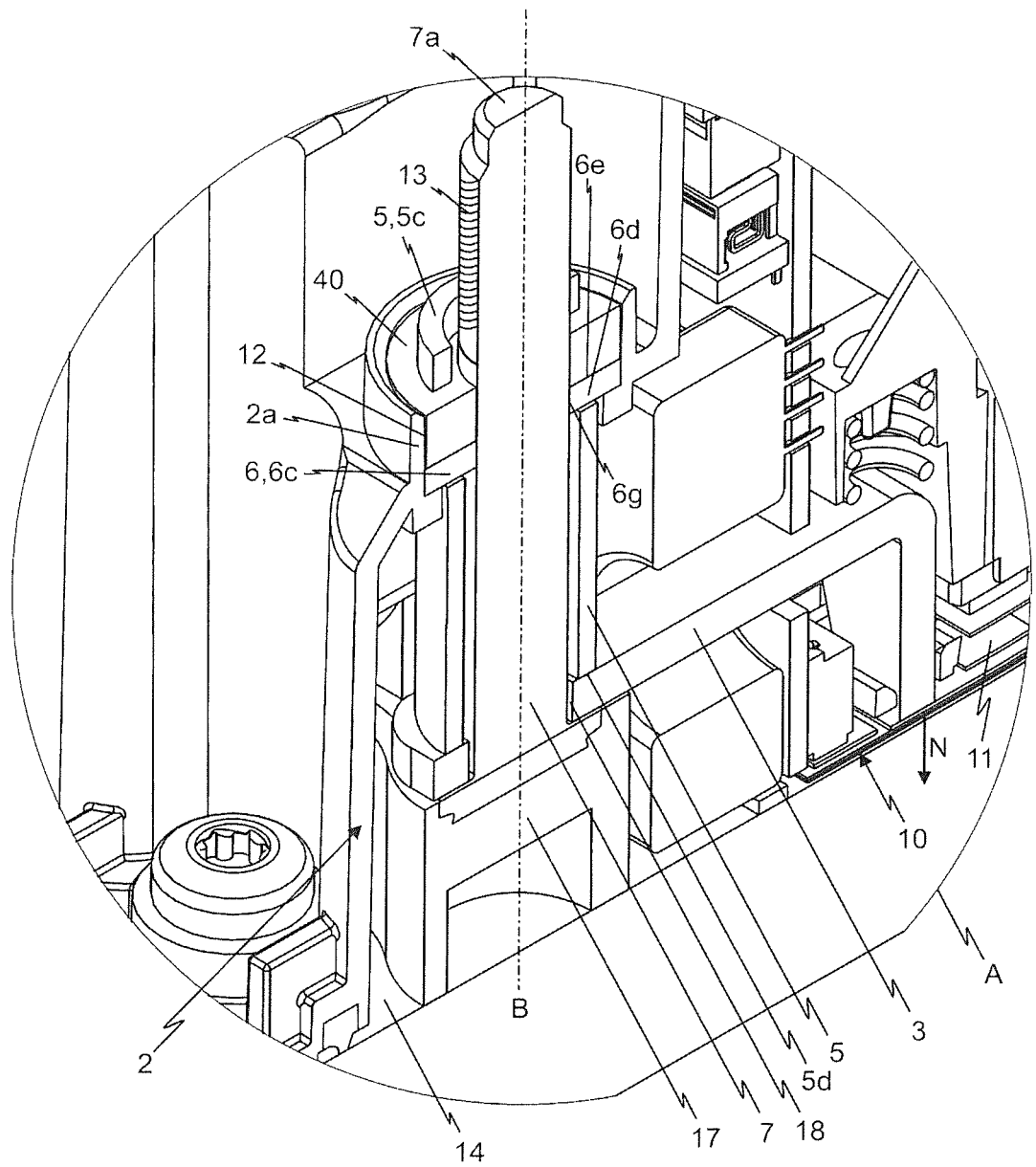
FIG. 3 shows a view of a detail from FIG. 2.
Figure 4:
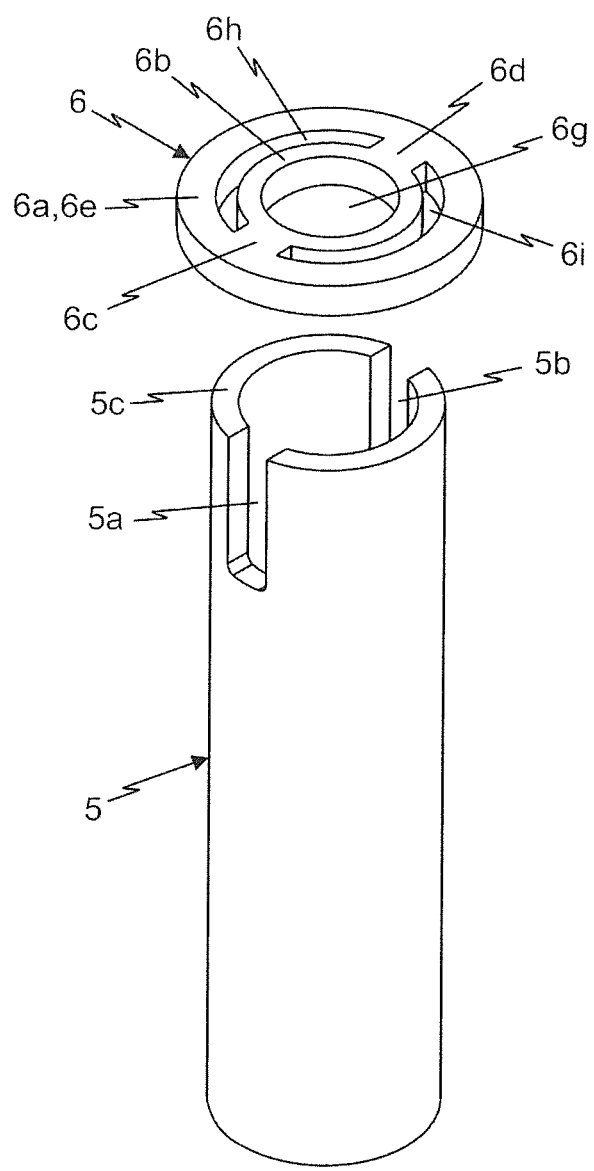
FIG. 4 shows a perspective exploded illustration of a portion of a sleeve and a sealing device of the power semiconductor device according to the invention as in FIG. 3.

FIG. 1 shows a perspective view of a power semiconductor arrangement 30 comprising a power semiconductor device 1 according to the invention. FIG. 2 shows a perspective sectional view of the power semiconductor device 1 according to the invention, and FIG. 3 shows an enlarged view of detail A from FIG. 2. FIG. 4 shows an exploded illustration of a perspective view of a sleeve 5 and a sealing device 6 of the power semiconductor device 1 according to the invention. During production of the power semiconductor device 1, within the scope of the exemplary embodiment the sealing device 6 is pushed onto the sleeve 5 in such a way that a first connecting section 6c of the sealing device 6 is arranged in a first recess 5a of the sleeve 5 and a second connecting section 6d of the sealing device 6 is arranged in a second recess 5b of the sleeve 5, and the upper part of the sleeve 5 runs through sealing device recesses 6h and 6i of the sealing device 6. The section illustrated in FIG. 2 and FIG. 3 runs through the connecting sections 6c and 6d and through the recesses 5a and 5b.

The power semiconductor arrangement 30 has a power semiconductor device 1 according to the invention and load current connection elements 4 which are each electrically conductively connected to a respective electrical connection element of the power semiconductor device 1, that is to say to a respective sleeve 5, with the aid of a force-generating element 9 which has a thread and is preferably designed as a screw nut. The load current connection elements 4 can be electrically conductively connected to an electric motor for supplying power to the electric motor, for example. The load current connection elements 4 can be designed, for example, as busbars or cable shoes. The power semiconductor device 1 generally has power semiconductor components 11 which are electrically connected up to form a converter and can, for example, generate the electric currents required for supplying power to an electric motor.

The power semiconductor device 1 has at least one power semiconductor component 11, but generally a plurality of power semiconductor components 11 which are electrically conductively connected to electrically conductive connecting elements 3 which are of one-piece or multiple-piece design. The power semiconductor components 11 are preferably arranged on at least one electrically conductive conductor track of a substrate 10 of the power semiconductor device 1. Here, the power semiconductor components 11 are electrically conductively connected to the at least one conductor track, preferably by means of a soldering or sintering metal layer which is arranged between the power semiconductor components 11 and the conductor tracks. The conductor tracks are formed by an electrically conductive patterned first conduction layer of the substrate 10. The respective power semiconductor component 11 is preferably present in the form of a power semiconductor switch or a diode. Here, the power semiconductor switches are preferably present in the form of transistors, such as IGBTs (Insulated Gate Bipolar Transistors) or MOSFETs (Metal Oxide Semiconductor Field Effect Transistors) for example.

Furthermore, the power semiconductor module 1 preferably has a base plate 14 on which the substrate 10 which, in the context of the exemplary embodiment, is designed as a Direct Copper Bonded Substrate (DCB Substrate) is arranged.

The connecting element 3 is electrically conductively connected to the power semiconductor component 11. Within the scope of the exemplary embodiment, the connecting element 3 is electrically conductively contacted by the substrate 10, for example by means of a materially bonded connection, such as a soldered, sintered or welded connection for example, to this end. The connecting element 3 is preferably at least substantially composed of copper or a copper alloy.

The power semiconductor device 1 has a housing 2 which is preferably composed of plastic. The housing 2 is preferably arranged on the base plate 4 and preferably connected to said base plate, for example by means of screws 19. The housing 2 covers the power semiconductor components 11. The housing 2 has a housing opening 12 through which a pin element 7 of the power semiconductor device 1 runs, which pin element has a thread 13 at least outside the housing 2.

The power semiconductor device 1 furthermore has an elastic sealing device 6 which is arranged between a housing opening wall 2a of the housing 2, which housing opening wall delimits the housing opening 12 and encircles the pin element 7, and the pin element 7. The sealing device 6 is preferably formed from an elastomer. The elastomer is preferably formed from a crosslinked silicone, in particular from a crosslinked silicone rubber. The sealing device 6 is, as in the exemplary embodiment, preferably of one-piece design, but can also be of multiple-piece design.

The power semiconductor device 1 furthermore has an electrically conductive sleeve 5 which is arranged over the connecting element 3, wherein the pin element 7 runs through the sleeve 5 and through a sealing element opening 6g of the sealing element 6. The sleeve 5 forms an electrical connection element of the power semiconductor device 1, that is to say the sleeve 5 serves to electrically connect an external current-carrying element, such as a load current connection element 4 for example, to the power semiconductor device 1. An electric load current flows through the material of the sleeve 5 during operation of the power semiconductor device 1. The sleeve 5, more precisely that side 5d of the sleeve 5 which faces the connecting element 3, is preferably, as shown in FIGS. 2 and 3, arranged on the connecting element 3 and is in electrically conductive contact with the connecting element 3. In the exemplary embodiment, the sleeve 5 is arranged on the connecting element 3 by way of resting on the connecting element 3. The sleeve 5 can be connected in a materially bonded manner to the connecting element 3, for example by means of a soldered, sintered or welded connection. In the exemplary embodiment, the sleeve 5 is not connected in a materially bonded manner to the connecting element 3. However, the sleeve 5 can also be arranged on the connecting element 3 and be in electrically conductive contact with the connecting element 3 by way of a soldering or sintering layer being arranged between the sleeve 5 and the connecting element 3. When the sleeve 5 is not arranged on the connecting element 3, there can be a narrow air gap between the sleeve 5 and the connecting element 3 in this case. The connecting element 3 preferably has a connecting element recess 18 through which the pin element 7 runs. The pin element 7 preferably runs in the normal direction N of the substrate 10. The sleeve 5 is preferably designed as a hollow cylinder. It should be noted that the sleeve 5 can be, in general, electrically conductively connected to the power semiconductor component 11 by means of any desired electrically conductive connecting means (for example cable, copper strip).

A first sealing element 6a of the sealing device 6 is arranged between the sleeve 5 and the housing opening wall 2a and a second sealing element 6b of the sealing device 6 is arranged between the sleeve 5 and the pin element 7. The respective sealing element 6a or 6b is of annular design. The sealing device 6 is not connected in a materially bonded manner to the sleeve 5, to the housing opening wall 2a and to the pin element 7. During production of the power semiconductor device 1, the sealing device 6 is present as an element which has already been prefabricated. The sealing device 6 seals off the housing opening wall 2a from the sleeve 5 by means of the first sealing element 6a and seals off the sleeve 5 from the pin element 7 by means of the second sealing element 6b.

As shown by way of example in FIG. 4, the sleeve 5 preferably has a first recess 5a which starts from its side 5c that faces a pin element outer end 7a of the pin element 7, which pin element outer end is arranged outside the housing 2, and which runs in the axial direction B of the pin element 7. In the exemplary embodiment, the sleeve 5 has a first recess 5a which starts from its side 5c that faces away from the connecting element 3 and which runs in the direction of the connecting element 3. Here, the sealing device 6 is of one-piece design and has a first connecting section 6c which runs through the first recess 5a and connects the first sealing element 6a to the second sealing element 6b. The first connecting section 6c, in interaction with the first recess 5a, ensures that the second sealing element part 6b remains in its position in a reliable manner and over the long term. It should be noted that the sealing device 6 can also be of multiple-piece design and therefore the first and the second sealing element 6a and 6b can also be designed as separate sealing rings for example.

The sleeve 5 preferably has a second recess 5b which starts from its side 5c that faces a pin element outer end 7a of the pin element 7, which pin element outer end is arranged outside the housing 2, and which runs in the axial direction B of the pin element 7. In the exemplary embodiment, the sleeve 5 has a second recess 5b which starts from its side 5c that faces away from the connecting element 3 and which runs in the direction of the connecting element 3, wherein the sealing device 6 has a second connecting section 6d which runs through the second recess 5b and connects the first sealing element 6a to the second sealing element 6b. Here, the second recess 5b is preferably arranged opposite the first recess 5a, wherein the second connecting section 6d is arranged opposite the first connecting section 6c.

The sleeve 5 is preferably at least substantially composed of copper or a copper alloy. The sleeve 5 can have a silver coating. The first and the second sealing element 6a and 6b and the sleeve 5 are each of hollow-cylindrical design within the scope of the exemplary embodiment, wherein the pin element 7 has a circular cross-sectional area.

The power semiconductor device 1 furthermore has a crosslinked potting compound 40 which is arranged on a side 6e of the sealing device 6 that is averted from the connecting element 3. The crosslinked potting compound 40 is arranged between the sleeve 5 and the housing opening wall 2a and between the sleeve 5 and the pin element 7, wherein the crosslinked potting compound 40 is connected in a materially bonded manner to the sleeve 5, to the housing opening wall 2a and to the pin element 7. The potting compound 40 seals off the housing opening wall 2a from the sleeve 5 and seals off the sleeve 5 from the pin element 7.

The crosslinked potting compound 40 is preferably formed from a crosslinked silicone, in particular from a crosslinked silicone rubber. During production of the power semiconductor device 1, a liquid or gelatinous uncrosslinked potting compound 40' (see FIG. 5) is arranged on that side 6e of the sealing device 6 which is averted from the connecting element 3 and is then crosslinked, as a result of which the crosslinked potting compound 40 which is connected in a materially bonded manner to the sleeve 5, to the housing opening wall 2a and to the pin element 7 is produced from the uncrosslinked potting compound 40'. The sealing device 6 prevents the liquid or gelatinous uncrosslinked potting compound 40' from flowing into that region of the power semiconductor device 1 which is arranged below the sealing device 6 within the housing 2 when said liquid or gelatinous uncrosslinked potting compound is provided.

In the invention, the crosslinked potting compound 40 acts as a main seal and the sealing device 6 acts as an auxiliary seal. The two-stage sealing off of the housing opening realized in the invention in this way prevents the ingress of particles of dirt and moisture into the interior of the housing in a reliable manner and over the long term. Since the sealing device 6 additionally also prevents the liquid or gelatinous uncrosslinked potting compound 40' from flowing into that region of the power semiconductor device 1 which is arranged below the sealing device 6 within the housing 2 when said liquid or gelatinous uncrosslinked potting compound is provided, the power semiconductor device 1 can furthermore also be produced in a simple and efficient manner.

The power semiconductor device 1 preferably has a holding body 17, wherein the pin element 7 is connected to the holding body 17 in a rotationally fixed manner, in particular is injection-moulded into the holding body 17. The holding body 17 is preferably arranged on the base plate 14 and is preferably connected to the base plate 14, for example by means of a screw connection.

The power semiconductor device 1 can be installed, for example, into a vehicle, such as a forklift truck for example, or, for example, into a switchgear cabinet. The vehicle, the switchgear cabinet or, in general, an external electrical component to which the power semiconductor device 1 according to the invention is intended to be electrically conductively connected has electrically conductive load current connection elements 4 which are provided in order to be electrically conductively connected to the power semiconductor device 1 according to the invention. The power semiconductor arrangement 30 is produced when the load current connection elements 4 are electrically connected to the power semiconductor device 1, more precisely to the sleeves 5. The respective load current connection element 4 is preferably at least substantially composed of copper or a copper alloy.

In order to produce the power semiconductor arrangement 30, an electrically conductive load current connection element 4 which has a third recess is arranged outside the housing 2 of the power semiconductor device 1 in such a way that the pin element 7 runs through the third recess. A force-generating element 9 which has a thread is then arranged and twisted onto the thread 13 of the pin element 7, so that the force generating element 9 generates a force F on the load current connection element 4, which force acts in the direction of the sleeve 5, more precisely a force which acts in the direction of that side 5c of the sleeve 5 which faces the load current connection element 4, as a result of which the load current connection element 4 is pressed against the sleeve 5, more precisely against that side 5c of the sleeve 5 which faces the load current connection element 4, and an electrically conductive pressure contact is formed between the sleeve 5 and the load current connection element 4. The sleeve 5 is electrically conductively contacted by the connecting element 3. The electrically conductive contact between the sleeve 5 and the connecting element 3 can be realized in the form of an electrically conductive materially bonded contact (for example soldered, welded or sintered connection) or, as in the exemplary embodiment, as a pressure contact. The sleeve 5, more precisely that side 5d of the sleeve 5 which faces the connecting element 3, presses against the connecting element 3 in the process.

If there is a narrow air gap between the sleeve 5 and the connecting element 3, the air gap is then closed by way of the sleeve 5, owing to the force F, moving toward the connecting element 3 until it is in mechanical contact and therefore also in electrically conductive contact with the connecting element 3. Here, use is made of the crosslinked potting compound 40 having a certain degree of elasticity. The connecting element 3 forms an abutment for the sleeve 5. The holding body 17 forms an abutment for the connecting element 3. The load current connection element 4 is electrically conductively connected to the connecting element 3 by means of the sleeve 7. The force-generating element 9 is preferably designed as a screw nut.

The power semiconductor arrangement 30 therefore has a power semiconductor device 1 according to the invention, an electrically conductive load current connection element 4 which has a third recess, and a force-generating element 9 which has a thread. The load current connection element 4 is arranged outside the housing 2 of the power semiconductor device 1 in such a way that the pin element 7 of the power semiconductor device 1 runs through the third recess, wherein the force-generating element 9 is twisted onto the thread 13 of the pin element 7 and generates a force F on the load current connection element 4, which force acts in the direction of the sleeve 5 of the power semiconductor device 1, as a result of which the load current connection element 4 is arranged pressed against the sleeve 5 and an electrically conductive pressure contact is formed between the sleeve 5 and the load current connection element 4, and as a result of which the sleeve 5 is arranged pressed against the connecting element 3 and an electrically conductive pressure contact is formed between the sleeve 5 and the connecting element 3 in the exemplary embodiment.

A method for producing the power semiconductor device 1 according to the invention with successive method steps will be specified below. Advantageous developments of the method are evident analogously to advantageous developments and variant developments of the above-described power semiconductor device 1 according to the invention, and therefore said advantageous developments are not described yet again in the text which follows in order to avoid repetition. The power semiconductor device 1 produced at the end of the method according to FIG. 5 corresponds to the power semiconductor device 1 according to the invention in line with FIGS. 1 to 4, including advantageous developments and variant developments.

Figure 5:
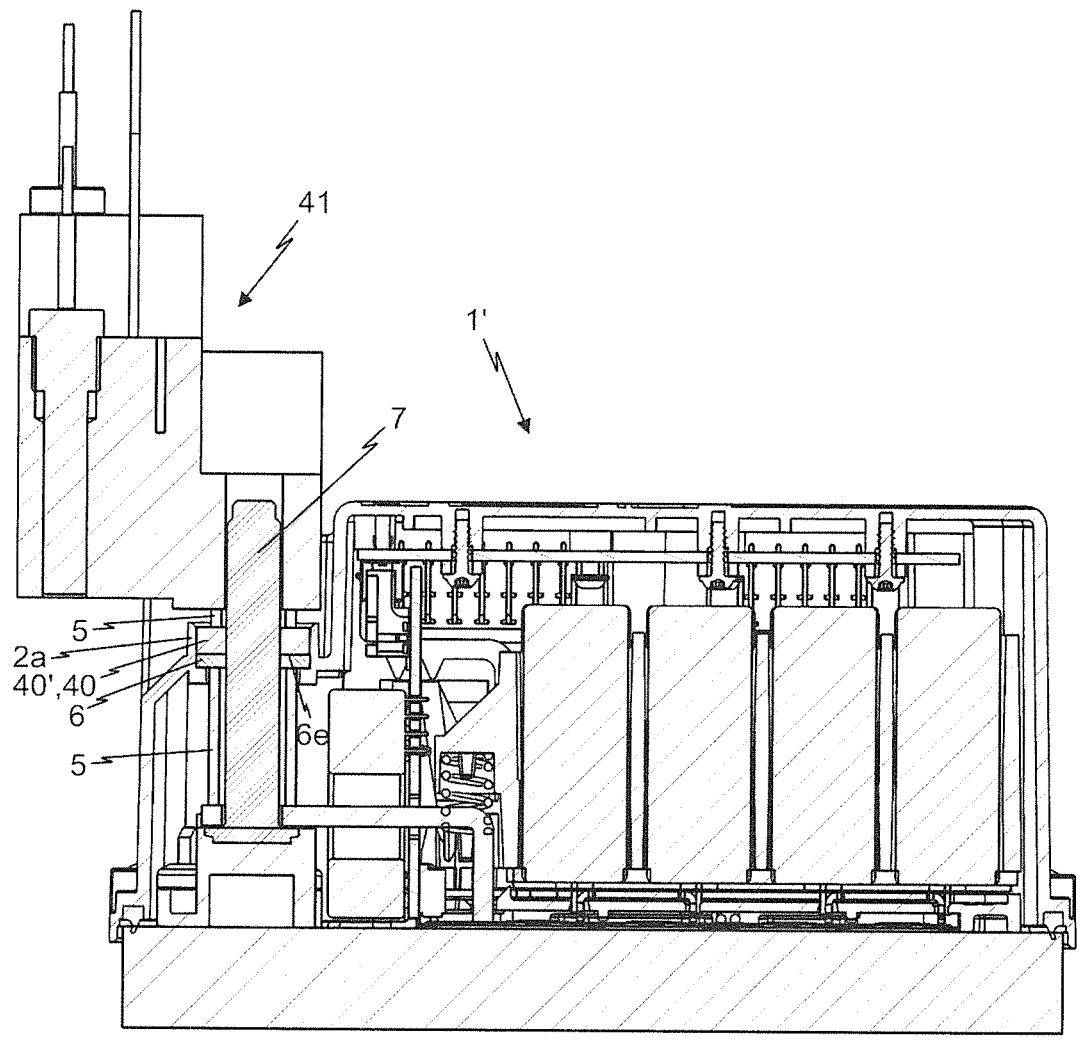
FIG. 5 shows a sectional view of a power semiconductor device precursor product and an external heat-generating device.

As illustrated by way of example in FIG. 5, a power semiconductor device precursor product 1' is provided in a first method step a). The power semiconductor device precursor product 1' has a power semiconductor component 11, a housing 2 which has a housing opening 12, preferably an electrically conductive connecting element 3 which is arranged within the housing 2 and is electrically conductively connected to the power semiconductor component 11, and a pin element 7 which passes through the housing opening 12 and has a thread 13 at least outside the housing 2. It should be noted that the thread 13 of the pin element 7 is not shown in FIG. 5 for reasons of clarity. The power semiconductor device precursor product 1' furthermore has an elastic sealing device 6 which is arranged between a housing opening wall 2a of the housing 2, which housing opening wall delimits the housing opening and encircles the pin element 7, and the pin element 7, and an electrically conductive sleeve 5 which is arranged over the connecting element 3 here. The pin element 7 runs through the sleeve 5 and through a sealing device opening 6g of the sealing element 6, wherein a first sealing element 6a of the sealing device 6 is arranged between the sleeve 5 and the housing opening wall 2a and a second sealing element 6b of the sealing device 6 is arranged between the sleeve 5 and the pin element 7, wherein the sealing device 6 is not connected in a materially bonded manner to the sleeve 5, to the housing opening wall 2a and to the pin element 7 and the sealing device 6 seals off the housing opening wall 2a from the sleeve 5 and seals off the sleeve from the pin element 7. The power semiconductor device precursor product 1' corresponds to the power semiconductor device 1 according to the invention in line with FIGS. 1 to 4 including advantageous developments and variant developments apart from the presence of the crosslinked potting compound 40. The crosslinked potting compound 40 is missing from the power semiconductor device precursor product 1'. It should be noted that the sleeve 5 can, in general, be electrically conductively connected to the power semiconductor component 11 by means of any desired electrically conductive connecting means (for example cable, copper strip).

In a subsequent further method step b), a liquid or gelatinous uncrosslinked potting compound 40' is arranged on the sealing device 6, here on a side 6e of the sealing device 6 that is averted from the connecting element 3, wherein the uncrosslinked potting compound 40' is arranged between the sleeve 5 and the housing opening wall 2a and between the sleeve 5 and the pin element 7, wherein the uncrosslinked potting compound 40' is in mechanical contact with the sleeve 5, with the housing opening wall 2a and with the pin element 7. That region of the housing opening wall 2a which is arranged above the sealing device 6 preferably forms a filling basin for the uncrosslinked potting compound 40' in the process.

In a subsequent further method step c), the uncrosslinked potting compound 40' is crosslinked, as a result of which a crosslinked potting compound 40 is formed, which seals off the housing opening wall 2a from the sleeve 5 and seals off the sleeve 5 from the pin element 7. Here, the crosslinking of the uncrosslinked potting compound 40' is preferably accelerated by way of the pin element 7 and/or the sleeve 5 being heated by means of an external heat-generating device 41. In the process, the uncrosslinked potting compound 40' is heated via the pin element 7 and/or the sleeve 5, this accelerating the crosslinking of said potting compound. Here, the uncrosslinked potting compound 40' can be composed of, for example, two components which are mixed together immediately before method step b) and carry out a crosslinking reaction. It should be noted here that, since the very large majority of the crosslinking occurs only after method step b) in this case, uncrosslinked potting compound 40' is still present in method step b) for the purposes of the invention. The crosslinking of the uncrosslinked potting compound 40' can also be initiated, for example, by irradiating the uncrosslinked potting compound 40' with UV light.

It is further observed that, naturally, characteristics of the various exemplary embodiments of the invention, provided that said characteristics are not mutually exclusive, can be mutually combined as desired, without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power semiconductor device, comprising:
    a power semiconductor component, further comprising:
        a housing having a housing opening, further comprising:
            a pin element which passes through the housing opening and has a thread at least positioned outside the housing;
            an elastic sealing device arranged between a housing opening wall of the housing, wherein the housing opening wall delimits the housing opening and encircles the pin element; and
        an electrically conductive sleeve which forms an electrical connection element of the power semiconductor device;
    the pin element runs through the sleeve and through a sealing device opening of the elastic sealing device;
    a first sealing element of the elastic sealing device is arranged between the sleeve and the housing opening wall and a second sealing element of the elastic sealing device is arranged between the sleeve and the pin element;
    wherein the elastic sealing device is not connected in a materially bonded manner to the sleeve (5), to the housing opening wall, or to the pin element;
    the elastic sealing device seals off the housing opening wall from the sleeve and seals off the sleeve from the pin element;
    a crosslinked potting compound which is arranged on the elastic sealing device, wherein the crosslinked potting compound is arranged between the sleeve and the housing opening wall and between the sleeve and the pin element;
    the crosslinked potting compound is connected in a materially bonded manner to the sleeve, to the housing opening wall and to the pin element; and
    the potting compound seals off the housing opening wall from the sleeve and seals off the sleeve from the pin element.

2. The power semiconductor device, according to claim 1, wherein:
    the crosslinked potting compound is formed from a crosslinked silicone, in particular from a crosslinked silicone rubber.

3. The power semiconductor device, according to claim 1, wherein:
    the sleeve, further comprises:
        a first recess which starts from a first side that faces a pin element outer end of the pin element, wherein the pin element outer end is arranged outside the housing;
        the first recess runs in an axial direction of the pin element; and
    wherein the elastic sealing device is of one-piece design and has a first connecting section which runs through the first recess and connects the first sealing element to the second sealing element.

4. The power semiconductor device, according to claim 3, wherein:
    the sleeve further comprises:
        a second recess which starts from the first side that faces the pin element outer end of the pin element, wherein the pin element outer end is arranged outside the housing, and which runs in the axial direction of the pin element;
    wherein the elastic sealing device has a second connecting section which runs through the second recess and connects the first sealing element to the second sealing element.

5. The power semiconductor device, according to claim 4, wherein:
    the second recess is arranged opposite the first recess and the second connecting section is arranged opposite the first connecting section.

6. The power semiconductor device, according to claim 5 wherein:
    the first and the second sealing element and the sleeve are each of a hollow-cylindrical design and the pin element has a circular cross-sectional area.

7. The power semiconductor device, according to claim 6, wherein:
    the elastic sealing device is formed from an elastomer.

8. The power semiconductor device, according to claim 7, wherein:
    the power semiconductor device further comprises:
        has a holding body
    wherein the pin element is connected to the holding body in a rotationally fixed manner, and in particular is injection-moulded into the holding body.

9. The power semiconductor device, according to claim 8, wherein:
    the power semiconductor device further comprises:
        an electrically conductive connecting element which is arranged within the housing and is electrically conductively connected to the power semiconductor component; and
    wherein the electrically conductive sleeve is arranged over the connecting element.

10. The power semiconductor device, according to claim 9, wherein:
    the sleeve is arranged on the connecting element.

11. A power semiconductor arrangement, comprising:
    a power semiconductor device according to claim 1;
    further comprising:
        an electrically conductive load current connection element which has a third recess and is arranged outside the housing in such a way that the pin element runs through the third recess;
        a force-generating element of the power semiconductor arrangement;
        said force-generating element has a tread and is twisted onto a thread of the pin element, and generates a force (F) on the load current connection element;
    whereby said force (F) acts in a direction of the sleeve, as a result of which the load current connection element is arranged pressed against the sleeve and an electrically conductive pressure contact is formed between the sleeve and the load current connection element.

12. A method for producing a power semiconductor device, comprising the steps of:

a) providing a power semiconductor device precursor product comprising a power semiconductor component, comprising a housing having a housing opening, comprising a pin element which is arranged within the housing and passes through the housing opening and has a thread at least outside the housing, comprising an elastic sealing device which is arranged between a housing opening wall of the housing and the pin element, wherein the housing opening wall delimits the housing opening and encircles the pin element, and comprising an electrically conductive sleeve which forms an electrical connection element of the power semiconductor device, wherein the pin element runs through the sleeve and through a sealing device opening of the elastic sealing device, wherein a first sealing element of the sealing device is arranged between the sleeve and the housing opening wall and a second sealing element of the elastic sealing device is arranged between the sleeve and the pin element, wherein the elastic sealing device is not connected in a materially bonded manner to the sleeve, to the housing opening wall or to the pin element and the elastic sealing device seals off the housing opening wall from the sleeve and seals off the sleeve from the pin element, b) arranging a liquid or gelatinous uncrosslinked potting compound on the elastic sealing device, wherein the uncrosslinked potting compound is arranged between the sleeve and the housing opening wall and between the sleeve and the pin element, wherein the uncrosslinked potting compound is in mechanical contact with the sleeve, with the housing opening wall and with the pin element, and c) crosslinking the uncrosslinked potting compound, as a result of which a crosslinked potting compound is formed, which seals off the housing opening wall from the sleeve and seals off the sleeve from the pin element.

13. The method according to claim 12, wherein:
the uncrosslinked potting compound is formed from an uncrosslinked silicone, in particular from an uncrosslinked silicone rubber.

14. The method according to claim 13, wherein:
in method step c), the crosslinking of the uncrosslinked potting compound is accelerated by way of the pin element and/or the sleeve being heated by means of application of an external heat-generating device.

* * * * *